United States Patent
Choi

(10) Patent No.: US 10,345,361 B2
(45) Date of Patent: Jul. 9, 2019

(54) MONITORING SYSTEM FOR DETECTING ERROR OF HARMONIC FILTER IN HIGH VOLTAGE DIRECT CURRENT (HVDC) SYSTEM, AND MONITORING METHOD THEREOF

(71) Applicant: LSIS CO., LTD., Gyeonggi-do (KR)

(72) Inventor: Yong Kil Choi, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 382 days.

(21) Appl. No.: 15/213,725

(22) Filed: Jul. 19, 2016

(65) Prior Publication Data
US 2017/0030959 A1 Feb. 2, 2017

(30) Foreign Application Priority Data
Jul. 30, 2015 (KR) .................. 10-2015-0108402

(51) Int. Cl.
| | |
|---|---|
| *G01R 31/40* | (2014.01) |
| *G01R 31/02* | (2006.01) |
| *H02J 3/01* | (2006.01) |
| *H02J 3/36* | (2006.01) |
| *H02J 1/02* | (2006.01) |

(52) U.S. Cl.
CPC .......... *G01R 31/028* (2013.01); *G01R 31/40* (2013.01); *H02J 1/02* (2013.01); *H02J 3/01* (2013.01); *H02J 3/36* (2013.01); *H02J 2003/365* (2013.01); *Y02E 40/40* (2013.01); *Y02E 60/60* (2013.01)

(58) Field of Classification Search
CPC .... G01R 31/40; H02J 3/01; H02J 3/36; Y02E 40/40; Y02E 40/60
See application file for complete search history.

(56) References Cited

U.S. PATENT DOCUMENTS

| | | | |
|---|---|---|---|
| 5,568,042 A | 10/1996 | Nyberg et al. | |
| 2011/0292696 A1* | 12/2011 | Xiao ................ | H02M 1/32 363/37 |

(Continued)

FOREIGN PATENT DOCUMENTS

| | | |
|---|---|---|
| CN | 101277011 A | 10/2008 |
| CN | 101359027 A | 2/2009 |

(Continued)

OTHER PUBLICATIONS

Dec. 14, 2016 Extended European Search Report for European App. No. 16162922.5 (8 pgs).

(Continued)

*Primary Examiner* — Melissa J Koval
*Assistant Examiner* — Courtney G McDonnough
(74) *Attorney, Agent, or Firm* — K&L Gates LLP

(57) ABSTRACT

Disclosed embodiments relate to a monitoring system for detecting an error of a harmonic filter in a high voltage direct current (HVDC) transmission system is disclosed. In some embodiments, the monitoring system comprises a harmonic filter including one or more capacitor units, a monitoring sensor unit sensing a voltage of at least one of the one or more capacitor units, and, a control unit monitoring a voltage error of the at least one capacitor unit using the sensing result.

15 Claims, 8 Drawing Sheets

(56) References Cited

U.S. PATENT DOCUMENTS

| | | | |
|---|---|---|---|
| 2012/0095613 A1* | 4/2012 | Tsuda | H02J 13/0013 700/297 |
| 2015/0092459 A1* | 4/2015 | Bergdahl | H03H 19/004 363/39 |
| 2015/0333656 A1 | 11/2015 | Choi | |

FOREIGN PATENT DOCUMENTS

| | | |
|---|---|---|
| CN | 201936442 U | 8/2011 |
| CN | 104280628 A | 1/2015 |
| EP | 1873885 | 1/2008 |
| JP | H07-177662 A | 7/1995 |
| JP | H1014109 A | 1/1998 |
| JP | H1155857 A | 2/1999 |
| JP | 2001-268718 A | 9/2001 |
| JP | 2009-244171 A | 10/2009 |
| JP | 2015-015889 A | 1/2015 |
| JP | 2017034987 A | 2/2017 |
| KR | 10-2006-0038542 A | 6/2007 |
| KR | 10-0883502 B1 | 2/2009 |
| KR | 20-2010-0009191 U | 9/2010 |
| KR | 10-1035702 B1 | 5/2011 |
| KR | 10-1265866 B1 | 5/2013 |
| KR | 10-1351067 B1 | 1/2014 |
| KR | 10-1351976 B1 | 1/2014 |
| KR | 20140134110 A | 11/2014 |
| KR | 10-1529975 B1 | 6/2015 |
| KR | 101529146 | 6/2015 |
| WO | WO 97/49167 | 12/1997 |
| WO | WO 2012/000510 | 1/2012 |

OTHER PUBLICATIONS

Korean Office Action for related Korean Application No. 10-2015-0108402; action dated Dec. 19, 2018; (79 pages).

Chinese Office Action for related Chinese Application No. 201610618964.1; action dated Sep. 29, 2018; (8 pages).

Chinese Office Action for related Chinese Application No. 201610618964.1; action dated May 5, 2019; (5 pages).

\* cited by examiner

PRIOR ART

PRIOR ART

MONITORING SYSTEM FOR DETECTING ERROR OF HARMONIC FILTER IN HIGH VOLTAGE DIRECT CURRENT (HVDC) SYSTEM, AND MONITORING METHOD THEREOF

CROSS-REFERENCE TO RELATED APPLICATIONS

This application claims the benefit of Korean Patent Application No. 10-2015-0108402, filed on Jul. 30, 2015, which is incorporated by reference in its entirety.

BACKGROUND

The present disclosure relates to a monitoring system for detecting an error of a harmonic filter in a high voltage direct current (HVDC) system, and a monitoring method thereof that may monitor a voltage error of a capacitor unit by the sensing of the voltage of the capacitor unit that configures a capacitor of the harmonic filter.

HVDC transmission is performed by converting alternating current (AC) power generated from a power station into direct current (DC) power to transmit the DC power and then re-converting the DC power into the AC power at a power receiving point to supply power. The HVDC transmission may enable efficient and economical power transmission through a voltage increase that is the advantage of AC power transmission, and overcome many limitations of the AC transmission.

The HVDC transmission needs the processes of converting the AC power into the DC power and converting the DC power into the AC power. In these processes, a harmonic wave is, however, generated by the characteristics of a switch and a load, and thus a harmonic filter is generally used in order to prevent an adverse effect by the harmonic wave.

The general configuration of such a harmonic filter is shown in FIG. 1.

Referring to FIG. 1, the harmonic filter includes a combination of one or more inductors, one or more capacitors, and one or more resistors. In addition, each of the one or more capacitors C1 to C3 may include a series/parallel combination of one or more capacitor units. The capacitor units may be connected in a series/parallel structure to configure a capacitor bank, which is shown in FIG. 2.

In the case where one or more of the capacitor units have a defect, a fault current by voltage imbalance may occur, and thus the capacitor bank and the harmonic filter have been typically protected by the method of detecting the fault current by using a leakage current detector.

However, since the typical method detects after an accident, i.e., after the fault current has occurred, there is a limitation in that there is a high possibility of failing to prevent the accident. Also, since the typical method detects the fault current, there is a limitation in that it is difficult to determine whether each of the capacitor units has an error.

SUMMARY

Embodiments provide a monitoring system for detecting an error of a harmonic filter in a high voltage direct current (HVDC) system, and a monitoring method thereof that may monitor a voltage error of a capacitor unit by the sensing of the voltage of the capacitor unit that configures a capacitor of the harmonic filter.

In an embodiment, a monitoring system for detecting an error of a harmonic filter in a high voltage direct current (HVDC) transmission system includes a harmonic filter including one or more capacitor units, a monitoring sensor unit sensing a voltage of at least one of the one or more capacitor units, and a control unit monitoring a voltage error of the at least one capacitor unit using the sensing result.

In another embodiment, a capacitor unit configuring a harmonic filter in an HVDC transmission system includes one or more capacitor, a sensing unit sensing the voltage of the capacitor unit, and a control unit monitoring a voltage error of the capacitor unit using the sensing result.

In further embodiment, a monitoring method of a monitoring system for detecting an error of a harmonic filter in an HVDC transmission system includes sensing a voltage of at least one of one or more capacitor units in the harmonic filter, and monitoring a voltage error of the at least one capacitor unit using the sensing result.

The details of one or more embodiments are set forth in the accompanying drawings and the description below. Other features will be apparent from the description and drawings, and from the claims.

DETAILED DESCRIPTION OF THE EMBODIMENTS

Figure 1:
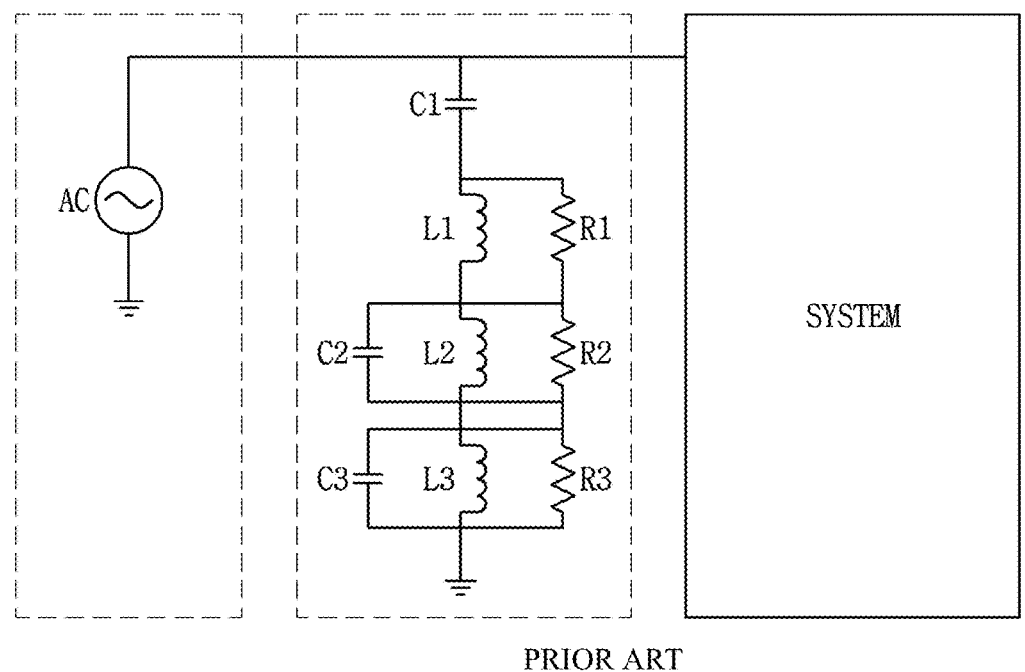
FIG. 1 is a diagram for explaining the configuration of a harmonic filter, according to prior art.
Figure 2:
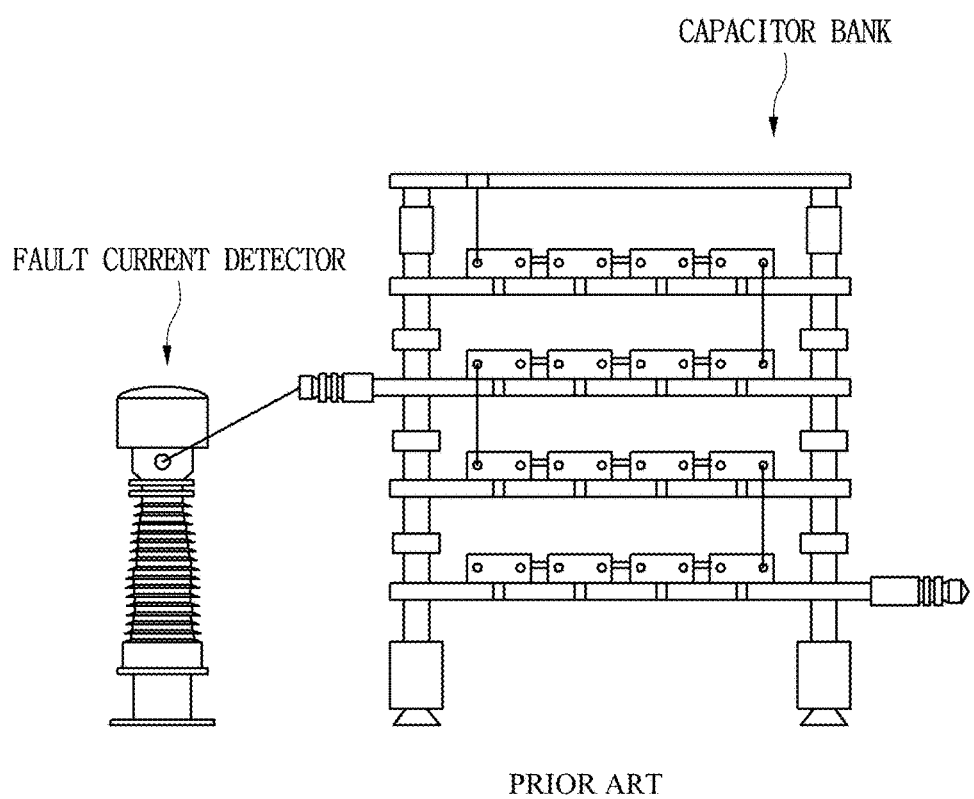
FIG. 2 is a diagram for explaining a method of detecting a fault current at a typical capacitor bank, according to prior art.

Hereinafter, embodiments are described in detail with reference to the accompanying drawings and regardless of the numbers of the drawings, same or similar components are assigned with the same reference numerals and thus repetitive descriptions for those are omitted. Since the suffixes "module" and "unit" for components used in the following description are given and interchanged for easiness in making the present disclosure, they do not have distinct meanings or functions. In describing the embodiments disclosed in the present disclosure, detailed descriptions of related known technologies will be omitted because they would obscure the subject of the embodiments disclosed in the present disclosure. Also, the accompanying drawings are only used to help easily understanding embodiments disclosed herein and the technical spirit disclosed in the present disclosure is not limited thereto. It should be understood that all of variations, equivalents or replacements contained in the spirit and technical scope of the present disclosure are also included.

Figure 3:
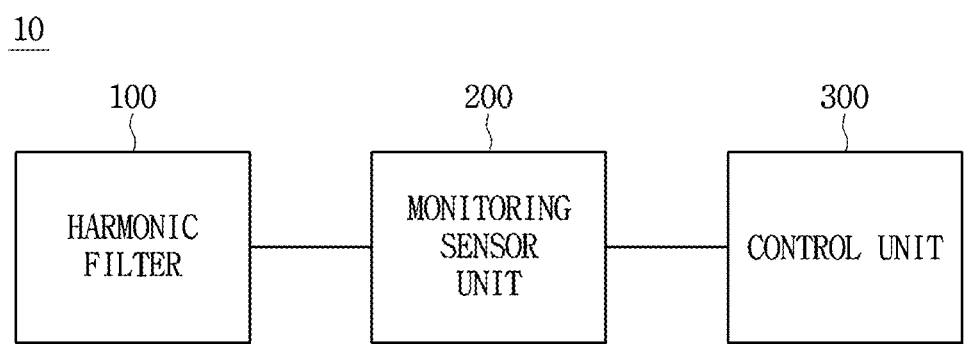
FIG. 3 is a block diagram of a monitoring system for detecting an error of the harmonic filter according to an embodiment of the present disclosure.

FIG. 3 is a block diagram of a monitoring system for detecting an error of a harmonic filter according to an embodiment.

Referring to FIG. 3, a monitoring system 10 for detecting an error of a harmonic filter in a high voltage direct current (HVDC) transmission system according to an embodiment may include a harmonic filter 100, a monitoring sensor unit 200, and a control unit 300.

The harmonic filter 100 may remove a harmonic wave that is generated at the HVDC system. In particular, HVDC transmission uses a thyristor converter that converts alternating current (AC) power into DC power, in which case a harmonic wave is generated due to the characteristic of the thyristor converter that performs phase control. In addition, the harmonic filter 100 may remove a harmonic wave that is generated in the process of converting power.

The harmonic filter may include a plurality of elements. In particular, the harmonic filter 100 may include a series/parallel combination of a capacitive element, an inductive element, and a resistor, and include a combination of a plurality of capacitive elements, a plurality of inductive elements, and a plurality of resistors so that it is possible to remove an nth-order harmonic wave that is generated in the process of rectifying AC power.

A capacitor may be used as the capacitive element and an inductor may be used as the inductive element.

In this example, the capacitor may include a series/parallel combination of a plurality of capacitor units. Also, the capacitor unit may include a series/parallel combination of a plurality of capacitor units. The plurality of capacitor units may be connected in a series/parallel combination to configure a capacitor bank.

The harmonic filter 100 may be installed at the transmitting end of the HVDC transmission system so that it is possible to remove a harmonic wave that is generated in the process of converting an AC into a DC, and may be installed at the receiving end of the HVDC transmission system so that it is possible to remove a harmonic wave that is generated in the process of converting the DC into the AC. Also, the harmonic filter 100 may supply reactive power to a system to improve the power factor of the system.

The monitoring sensor unit 200 may sense the voltage of at least one of one or more capacitor units in the harmonic filter. In particular, the harmonic filter may include one or more capacitors and each of the one or more capacitors in the harmonic filter may include the voltage of one or more capacitor units. In addition, the monitoring sensor unit 200 may sense the voltage of each of the capacitor units.

The monitoring sensor unit 200 may include one or more monitoring sensors that may sense the voltage of each of the capacitor units. For example, the monitoring sensor unit 200 may include a first monitoring sensor, a second monitoring sensor, and a third monitoring sensor, and the first monitoring sensor, the second monitoring sensor, and the third monitoring sensor may sense a first capacitor unit, a second capacitor unit, and a third capacitor unit, respectively in the harmonic filter 100.

Each of one or more monitoring sensors may include a sensor module for detecting the voltage of a capacitor unit, and a communication unit for transmitting the detected voltage of the capacitor unit to the control unit 300.

In addition, each of one or more monitoring sensors may detect the voltages of capacitor units corresponding to one or more monitoring sensors and transmit the detected voltage values to the control unit 300.

The control unit 300 may use a sensing result transmitted from the monitoring sensor unit 200 to monitor a voltage error of the capacitor unit.

In addition, the monitoring system 10 for detecting an error of the harmonic filter in the HVDC system according to an embodiment may further include a storage unit (not shown) that stores data.

The control unit 300 may monitor a voltage error of each of one or more capacitor units and store, in the storage unit (not shown), a result of monitoring the voltage error at each of one or more capacitor units.

Figure 4:
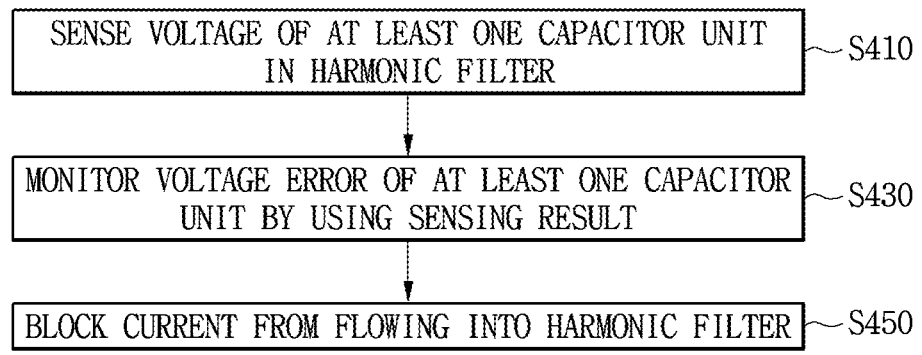
FIG. 4 is a flow chart of the monitoring method of the monitoring system for detecting an error of the harmonic filter in a high voltage direct current (HVDC) transmission system according to an embodiment of the present disclosure.

FIG. 4 is a flow chart of the monitoring method of the monitoring system for detecting an error of the harmonic filter in the high voltage direct current (HVDC) system according to the embodiment.

Referring to FIG. 4, the monitoring method of the monitoring system for detecting an error of the harmonic filter in the high voltage direct current (HVDC) system according to the embodiment may include sensing the voltage of at least one of one or more capacitor units in the harmonic filter in step S410, monitoring a voltage error of the at least one capacitor unit by using a result of sensing in step S430, and blocking a current flowing into the harmonic filter when detecting the voltage error at the at least one capacitor unit in step S450.

Sensing the voltage of at least one of one or more capacitor units in the harmonic filter in step S410 is described in detail with reference to FIGS. 5a and 5b.

Figure 5A:
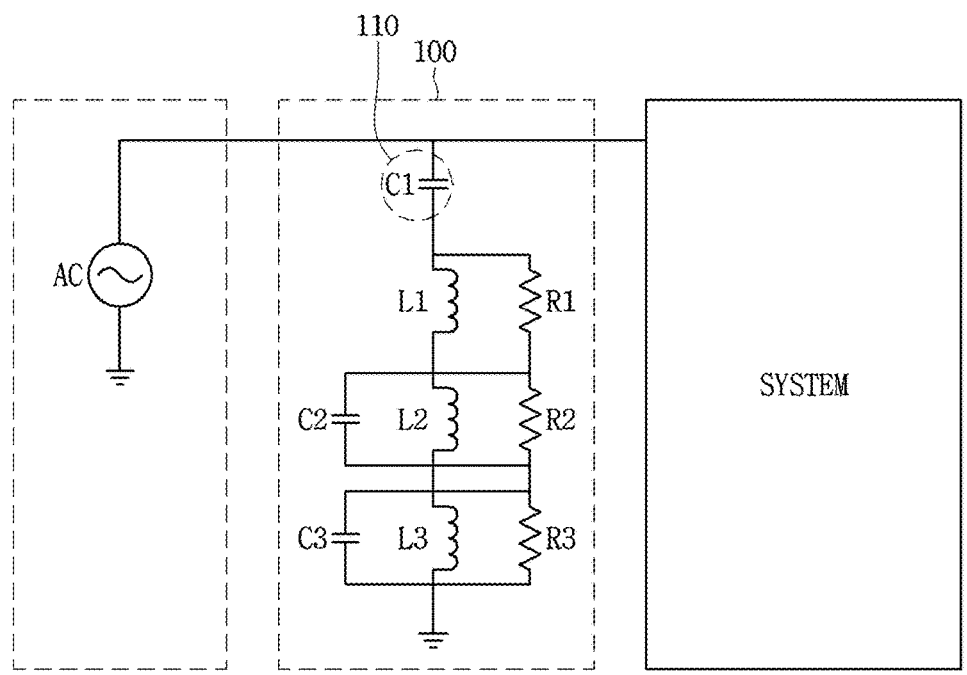
FIGS. 5a and 5b are diagrams for explaining a method of sensing a voltage of at least one of one or more capacitor units in a harmonic filter 100 according to some embodiments of the present disclosure.
Figure 5B:
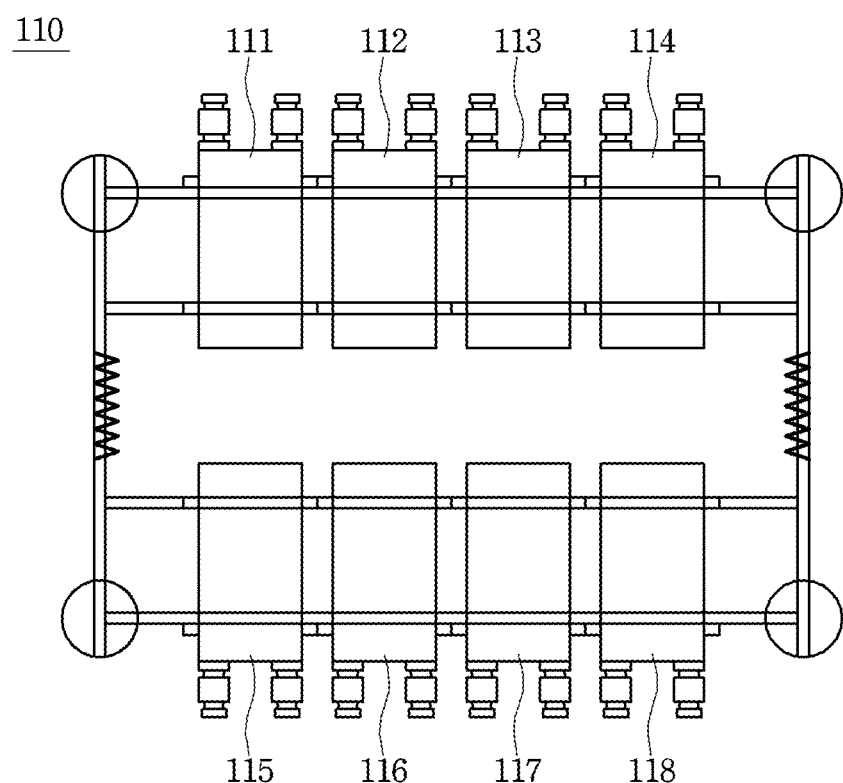

FIGS. 5a and 5b are diagrams for explaining a method of sensing the voltage of at least one of one or more capacitor units in the harmonic filter 100 according to some embodiments.

Referring to FIG. 5a, the harmonic filter 100 may include a plurality of elements. In particular, the harmonic filter 100 may include a plurality of capacitors C1 to C3, a plurality of inductors L1 to L3, and a plurality of resistors R1 to R3 as shown in FIG. 5a, and remove a harmonic wave equal to or higher than a reference value through a combination of the capacitors, inductors, and resistor elements. Although FIGS. 5a and 5b show the harmonic filter that includes three capacitors, three inductors, and three resistors, the harmonic filter in the embodiment is not limited thereto and may be all filters that may remove a harmonic wave through various combinations of one or more capacitor, inductor, and resistor elements.

Each of the plurality of capacitors C1 to C3 may include one or more capacitor units. For example, in the case where the harmonic filter 100 includes first, second, third, fourth, fifth, sixth, seventh, eighth, and ninth capacitor units, the capacitor C1 may include the first, the second, the third and the fourth capacitor units, the capacitor C2 may include the fifth and the sixth capacitor units, and the capacitor C3 may include the seventh, the eighth, and the ninth capacitor units.

That is, a first capacitor 110 in the harmonic filter 100 may include a series/parallel combination of at least one of one or more capacitor units in the harmonic filter 100.

FIG. 5b is a diagram for explaining the detailed configuration of the first capacitor 110.

As shown in FIG. 5b, the first capacitor 110 may include one or more capacitors 111 to 118. In addition, the one or more capacitor units 111 to 118 may be connected by a series/parallel combination to configure the first capacitor 110.

Each of the one or more capacitor units may include one or more cell capacitors, and the cell capacitors may be connected in series/parallel to configure one capacitor unit.

Figure 6:
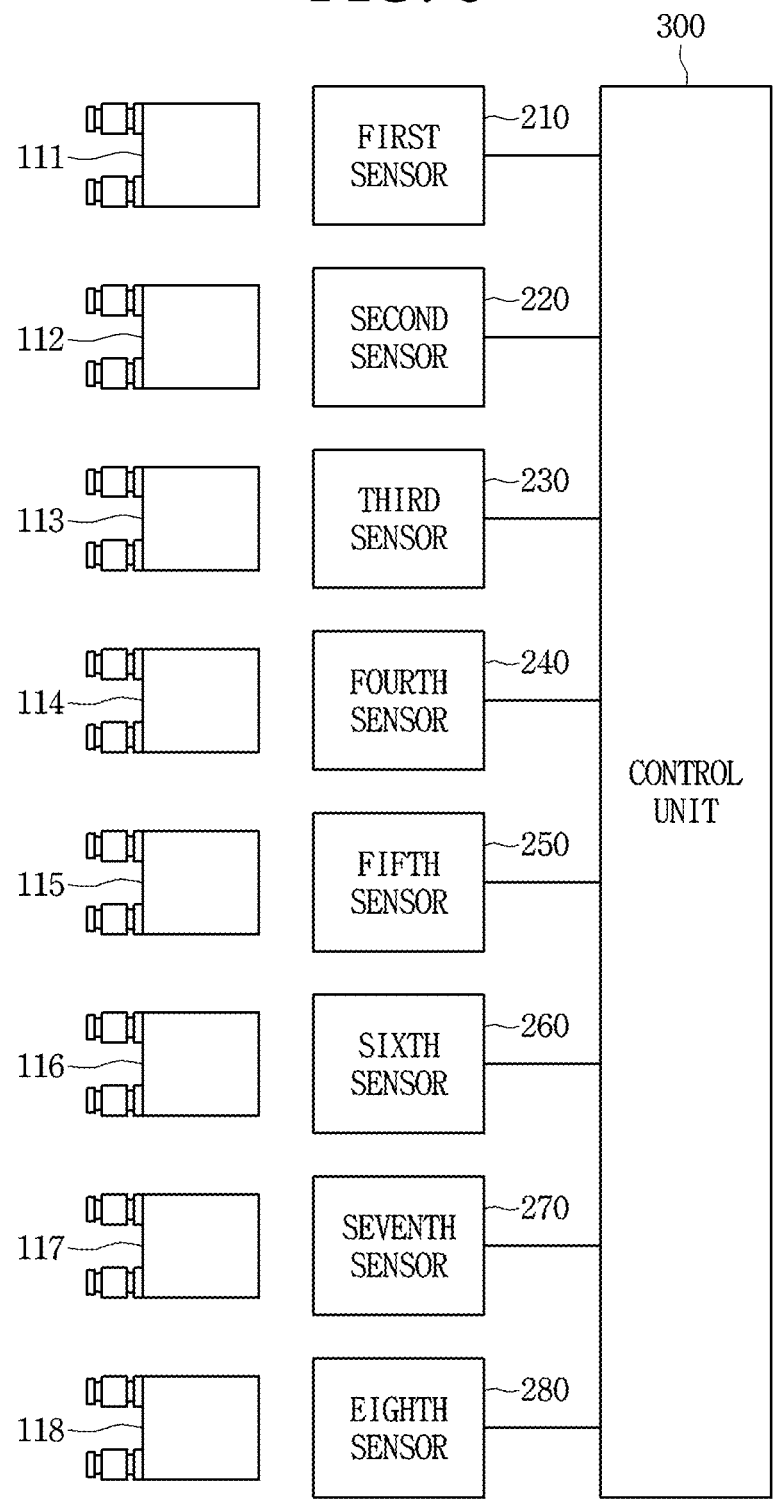
FIG. 6 is a diagram for explaining one or more monitoring sensors in a monitoring sensor unit 200, according to an embodiment of the present disclosure.

FIG. 6 is a diagram for explaining one or more monitoring sensors in the monitoring sensor unit 200.

The monitoring sensor unit 200 may include one or more monitoring sensors 210 to 280. In addition, the number of monitoring sensors in the monitoring sensor units 200 may be the same as that of capacitor units in the harmonic filter 100. That is, the monitoring sensor unit 200 may include many monitoring sensors corresponding to the number of capacitor units in the harmonic filter.

Each of the monitoring sensors 210 to 280 may detect the voltage of a capacitor unit that corresponds to each monitoring sensor. For example, a first monitoring sensor 210 may detect the voltage of the first capacitor unit 111 and a second monitoring sensor 220 may detect the voltage of the second capacitor unit 112.

Each of the monitoring sensors 210 to 280 is a potential transformer (PT) and may measure the magnitude of the voltage applied to a wire.

In addition, each of one or more monitoring sensors may transmit the result of sensing the voltage of a corresponding capacitor unit to the control unit 300.

The control unit 300 may receive, from the plurality of monitoring sensors 210 to 280, the result of sensing the voltages of the capacitor units 111 to 118 that correspond to the plurality of monitoring sensors, respectively.

In addition, the control unit 300 may use the result of sensing received from the plurality of monitoring sensors 210 to 280 to monitor the voltage error of each of the capacitor units 111 to 118.

In the case where the control unit 300 detects the voltage error of a specific capacitor unit, it is possible to use the voltage imbalance between the specific capacitor unit and other capacitor units to detect the voltage error of the specific capacitor unit.

For example, in the case where the charged voltages of the plurality of capacitor units 111 to 118 are equally set to 30 V according to the initial design, the voltage of the first capacitor unit 111 is 25 V, and the voltages of other capacitor units 112 to 118 excluding the first capacitor unit are 30 V, the control unit 300 may use the voltage imbalance that occurs between the first capacitor unit and other capacitor units 112 to 118, to monitor the voltage error of the first capacitor unit 111.

As another example, in the case where the charged voltages of the first to fourth capacitor units 111 to 114 are set to 25 V according to the initial design, the charged voltages of the fifth to eighth capacitor units 115 to 118 are set to 30 V according to the initial design, and the voltage of the first capacitor unit 111 is detected as 20 V, the control unit 300 may use the voltage imbalance between the first capacitor unit and the second to fourth capacitor units 112 to 114 to detect the voltage error of the first capacitor unit 111. Also, the control unit 300 may use the fact that the voltage difference between the first capacitor unit 111 and the fifth to eighth capacitor units 115 to 118 is changed from 5 V to 10 V, to detect the voltage error of the first capacitor unit 111.

In the case where the control unit 300 detects the voltage error of a specific capacitor unit, it is possible to compare the reference voltage value of the specific capacitor unit with the current voltage value of the specific capacitor unit to monitor the voltage error of the specific capacitor unit.

For example, in the case where the reference voltage charged in the first capacitor unit 111 is set to 30 V according to the initial design and the charged voltage of the first capacitor unit 111 sensed through the first sensor 210, the control unit 300 may determine that the first capacitor unit 111 has had a voltage error. The reference voltage values of the plurality of capacitor units 111 to 118 may be stored in a storage unit (not shown).

The control unit 300 may store the result of monitoring one or more capacitor units in the storage unit (not shown). In particular, the control unit 300 may store, in the storage unit (not shown), the voltage value of each of one or more capacitor units and information on the time at which the voltage is measured.

Also, the control unit 300 may transmit the result of monitoring one or more capacitor units to a server (not shown). To this end, the control unit 300 may include a communication module that may communicate with the server (not shown). The server (not shown) may be a server that a provider providing power in an HVDC system operates, and also be a server of a company that manages received power by using the HVDC system. In addition, such a provider or company may use the information received from the control unit 300 to monitor a voltage error that occurs in the harmonic filter.

Also, only in the case where at least one of one or more capacitor units has a voltage error, the control unit 300 transmits the monitoring result to the server (not shown) to be capable of informing the provider that the voltage error has occurred.

Although the embodiment has described that the control unit 300 transmits the monitoring result to the server (not shown), it is not limited thereto. For example, each of the plurality of monitoring sensors 210 to 280 that configures the monitoring sensor unit 200 may include a communication module that may communicate with the server (not shown). In addition, each of the plurality of monitoring sensors 210 to 280 that configures the monitoring sensor unit 200 may directly communicate with the server (not shown) to transmit, to the server (not shown), the voltage value of each of the plurality of capacitor units 111 to 118. In addition, the server (not shown) may use the data transmitted by the monitoring sensor unit 200 to monitor a voltage error at the harmonic filter 100.

A monitoring system for detecting the error of the harmonic filter according to the embodiment may further include a gas insulated switchgear (GIS). In addition, the control unit 300 may enable the GIS to block a current from flowing into the harmonic filter when it is detected that at least one of the plurality of capacitor units 111 to 118 has a voltage error. For example, the control unit 300 may enable the GIS to block a current from flowing into the harmonic filter when it is detected that the first capacitor unit 111 has a voltage error.

Figure 7:
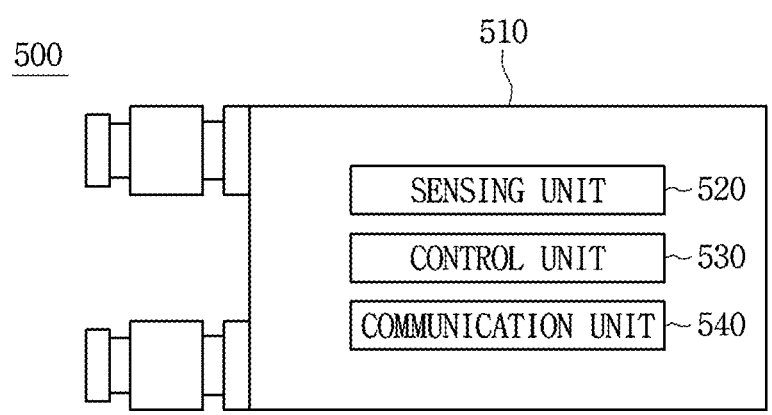
FIG. 7 is a diagram for explaining a capacitor unit that configures a harmonic filter in an HVDC transmission system according to another embodiment of the present disclosure.

FIG. 7 is a diagram for explaining a capacitor unit that configures a harmonic filter in an HVDC transmission system according to another embodiment.

In this example, a capacitor unit 500 may be one of the plurality of capacitor units in the harmonic filter 100.

Referring to FIG. 7, the capacitor unit 500 may include one or more capacitors. In particular, the capacitor unit 500 may include a series/parallel combination of one or more capacitor units.

The capacitor unit 500 may include a sensing unit 520 that senses the voltage of a capacitor unit. The sensing of the voltage of the capacitor unit by the sensing unit 520 may be performed in the same manner as the operation performed by the monitoring sensor unit 200 in FIG. 6.

Also, the capacitor unit 500 may include a control unit 530 that uses the sensing result to monitor the voltage error of the capacitor unit 500. The sensing of the voltage of the capacitor unit 500 by the control unit 530 may be performed in the same manner as the operation performed by the control unit 300 in FIG. 6. The capacitor unit 500 may include a storage unit (not shown) for storing the reference voltage value of the capacitor unit.

The capacitor unit 500 may include a communication unit 540 that communicates with a server (not shown). In addition, when it is detected that the capacitor unit has a voltage error, the control unit 530 may transmit identification information on the capacitor unit 500 and the voltage value detected at the sensing unit 520 to the server (not shown) through the communication unit 540. In this example, the server (not shown) may be a server that a provider side providing power in an HVDC system operates, and the provider may use the information received from the control unit 300 to monitor a voltage error that occurs at a harmonic filter.

The capacitor unit 500 may include a light output unit (not shown). In addition, the control unit 300 may output a flicker signal for informing the voltage error of the capacitor unit through the light output unit when it is detected that the capacitor unit 500 has a voltage error. Thus, a user may easily identify which one of the plurality of capacitor units has a voltage error.

Although the embodiment has described that the plurality of monitoring sensors 210 to 280 is used to monitor the voltage error of each of the plurality of capacitor units 111 to 118, it is not limited thereto.

In particular, the control unit 300 may divide the plurality of capacitor units into a specific number of groups of capacitor units and monitor voltage errors based on each group.

For example, it is possible to divide the plurality of capacitor units 111 to 118 into a first group of capacitor units 111 to 113, a second group of capacitor units 114 to 116, and a third group of capacitor units 117 and 118 and use three monitoring sensors to monitor the voltage errors of the first to third groups.

In this case, since a resistor used for the monitoring sensor is a variable resistor, it is possible to use the same monitoring sensor to monitor the voltage errors of a different number of capacitor units. For example, it is also possible to use a monitoring sensor to monitor the voltage error of a single capacitor unit, and it is also possible to adjust the resistance of the same monitoring sensor to monitor the voltage errors of a plurality of capacitor units in a single group.

As discussed above, the monitoring system according to the embodiment does not monitor a fault current that may occur at a capacitor bank but monitors a voltage error that may cause the fault current so that it is possible to prevent the fault current from becoming generated.

Also, since the monitoring system according to the embodiment monitors the voltage error of each of capacitor units, it is possible to easily identify a faulty capacitor unit and thus maintenance may be easy.

Also, in the case where a single capacitor unit has a fault, the fault may typically affect the surrounding capacitor unit but the monitoring system according to the embodiment may easily identify and replace a capacitor unit that has a voltage error and thus it is possible to prevent the fault from spreading.

Also, since the monitoring system according to the embodiment may monitor the voltage error of each capacitor unit and also monitor voltage errors based on the group of capacitor units, it is possible to save money needed for using a plurality of monitoring sensors.

The control unit 300 generally is a component responsible for controlling a device and may be interchanged with the term, such as a central processing unit, a micro processor, or a processor.

The above-described embodiment may be implemented as a computer readable code in a medium on which a program has been recorded. A computer readable medium includes all kinds of storage devices storing data that may be read by a computer system. Examples of the computer readable medium are a hard disk drive (HDD), a solid state disk (SSD), a silicon disk drive (SDD), a flash memory drive, a ROM, a RAM, a CD-ROM, a magnetic tape, a floppy disk, and an optical data storage device. Also, the computer may also include the control unit 180 of a terminal. Thus, the detailed description should not be construed as limiting and should be considered as describing certain examples. The scope of the present disclosure should be defined by the reasonable understanding of the following claims and all changes falling within the equivalent scope of the present disclosure are included in the scope of the present disclosure.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A monitoring system for detecting an error of a harmonic filter in a high voltage direct current (HVDC) transmission system, wherein the HVDC transmission system converts AC power into DC power and converts the DC power into the AC power, wherein the harmonic filter removes a harmonic wave that is generated at the HVDC transmission system, the monitoring system comprising:
a harmonic filter comprising at least one capacitor, at least one inductor, and at least one resistor, and removing a harmonic wave through a combination of the at least one capacitor, the at least one inductor, and the at least one resistor, wherein the at least one capacitor includes a first capacitor, wherein the first capacitor comprises a plurality of capacitor units;
a monitoring sensor unit configured to sense a plurality of voltages corresponding to the plurality of capacitor units, respectively; and
a control unit configured to determine a voltage error of the plurality of capacitor units based on a sensing result.

2. The monitoring system according to claim 1, wherein the plurality of capacitor units comprise a first capacitor unit and charging voltages of the plurality of capacitor units are equally set, and
wherein the control unit is further configured to determine a voltage error of the first capacitor unit if a voltage of the first capacitor unit is different from voltages of other capacitor units other than the first capacitor unit among the plurality of capacitor units.

3. The monitoring system according to claim 1, wherein the plurality of capacitor units comprise a first capacitor unit, and
wherein the control unit is further configured to determine a voltage error of the first capacitor unit by comparing a reference voltage value of the first capacitor unit with a current voltage value of the first capacitor unit.

4. The monitoring system according to claim 1, further comprising a gas insulated switchgear (GIS) configured to block a current from flowing into the harmonic filter,
wherein the control unit is further configured to switch the GIS to block the current from flowing into the harmonic filter when the voltage error of the at least one of the plurality of capacitor units is detected.

5. The monitoring system according to claim 1, further comprising a capacitor bank,
wherein the capacitor bank comprises a combination of the plurality of capacitor units.

6. The monitoring system according to claim 1, wherein the plurality of capacitor units are divided into a plurality of groups,
wherein the monitoring sensor unit is further configured to sense voltages of each of the plurality of groups.

7. The monitoring system according to claim 1, further comprising a storage unit that stores data,
wherein the control unit is further configured to store a result of the determination of the voltage error of the plurality of capacitor units in the storage unit.

8. The monitoring system according to claim 7, wherein the result of the determination of the voltage error of the plurality of capacitor units is a voltage value of each of the plurality of capacitor units, and a time at which the voltage value of each of the plurality of capacitor units is measured.

9. A monitoring method of a monitoring system for detecting an error of a harmonic filter in a high voltage direct current (HVDC) transmission system, wherein the HVDC transmission system converts AC power into DC power and converts the DC power into the AC power, wherein the harmonic filter removes a harmonic wave that is generated at the HVDC transmission system, the monitoring method comprising:
sensing a plurality of voltages corresponding to a plurality of capacitor units, respectively, in a harmonic filter, wherein the harmonic filter comprises a first capacitor, wherein the first capacitor comprises a combination of at least one of the plurality of capacitor units; and
determining a voltage error of the plurality of capacitor units based on the sensed voltage,
wherein the harmonic filter comprises at least one capacitor, at least one inductor, and at least one resistor, and removes a harmonic wave through a combination of the at least one capacitor, the at least one inductor, and the at least one resistor, and
wherein the at least one capacitor includes the first capacitor.

10. The monitoring method according to claim 9, wherein the plurality of capacitor units comprise a first capacitor unit and charging voltages of the plurality of capacitor units are equally set, and
wherein the determining the voltage error of the plurality of capacitor units comprises determining a voltage error of a first capacitor unit if a voltage of the first capacitor unit is different from voltages of other capacitor units other than the first capacitor unit among the plurality of capacitor units.

11. The monitoring method according to claim 9, wherein the plurality of capacitor units comprise a first capacitor unit, and
wherein the determining the voltage error of the plurality of capacitor units comprises determining a voltage error of the first capacitor unit by comparing a reference voltage value of the first capacitor unit with a current voltage value of the first capacitor unit.

12. The monitoring method according to claim 9, further comprising switching a gas insulated switchgear (GIS) to block a current from flowing into the harmonic filter when the voltage error of the at least one of the plurality of capacitor units is detected.

13. The monitoring method according to claim 9, wherein the monitoring system for detecting the error of the harmonic filter comprises a capacitor bank,
wherein the capacitor bank comprises a combination of the plurality of capacitor units.

14. The monitoring method according to claim 9, wherein the plurality of capacitor units are divided into a plurality of groups,
and wherein sensing the voltage of the at least one of the one or more capacitor units comprises sensing voltages of each of the plurality of groups.

15. The monitoring method according to claim 9, further comprising storing a result of determining the voltage error of the plurality of capacitor units.

\* \* \* \* \*